United States Patent [19]
Schlig

[11] Patent Number: 5,400,028
[45] Date of Patent: Mar. 21, 1995

[54] CHARGE SUMMING DIGITAL TO ANALOG CONVERTER

[75] Inventor: Eugene S. Schlig, Somers, N.Y.

[73] Assignee: International Business Machines Corporation, Armonk, N.Y.

[21] Appl. No.: 968,697

[22] Filed: Oct. 30, 1992

[51] Int. Cl.6 .............................................. H03M 1/66
[52] U.S. Cl. ..................................... 341/150; 341/144
[58] Field of Search ............... 341/150, 144, 154, 159; 307/246

[56] References Cited

U.S. PATENT DOCUMENTS

| | | |
|---|---|---|
| 3,836,906 | 9/1974 | Ando et al. ........................... 341/150 |
| 4,028,694 | 6/1977 | Cook et al. . |
| 4,099,175 | 7/1978 | Rubin . |
| 4,107,550 | 8/1978 | Jacquart et al. . |
| 4,145,689 | 3/1979 | Butler et al. . |
| 4,184,152 | 1/1980 | Mukawa . |
| 4,326,192 | 4/1982 | Merrill et al. ........................ 341/150 |
| 4,667,178 | 5/1987 | Ryu . |
| 4,713,650 | 12/1987 | Temes et al. . |
| 4,766,430 | 8/1988 | Gillette et al. . |

Primary Examiner—Brian K. Young
Attorney, Agent, or Firm—David Aker

[57] ABSTRACT

A D/A converter which develops the analog output by summing binary-weighted packets of electrical charge. Charge metering techniques are used to generate and sum the charge packets. It is particularly suited to application in the data line driver circuits of thin-film transistor liquid crystal displays. Various embodiments use single or multiple charge packet generators, and the multiple version may generate the packets for the various bits simultaneously, For the highest speed, or else sequentially, for the largest voltage dynamic range.

13 Claims, 6 Drawing Sheets

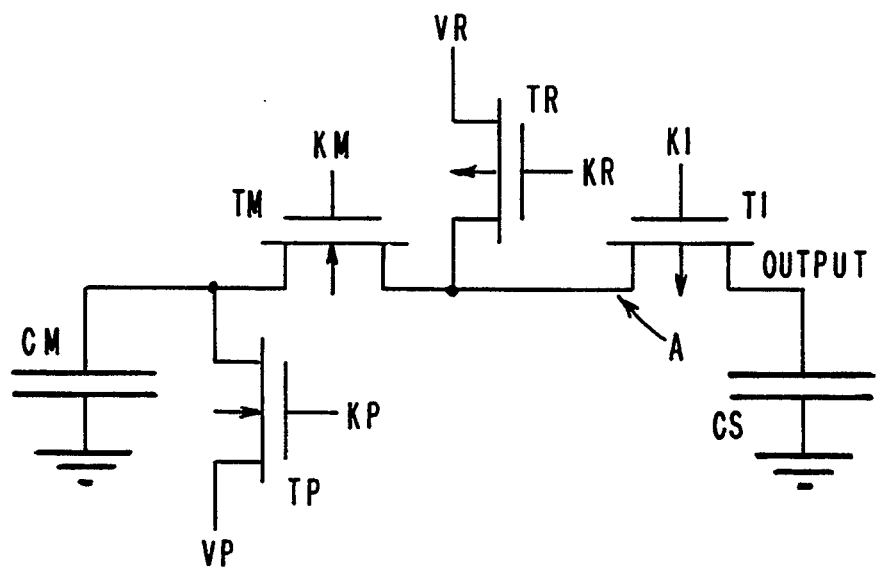
FIG. 1
FIG. 2A  KP 
FIG. 2B  KR 
FIG. 2C  KI 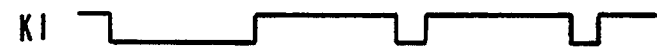
FIG. 2D  KM 
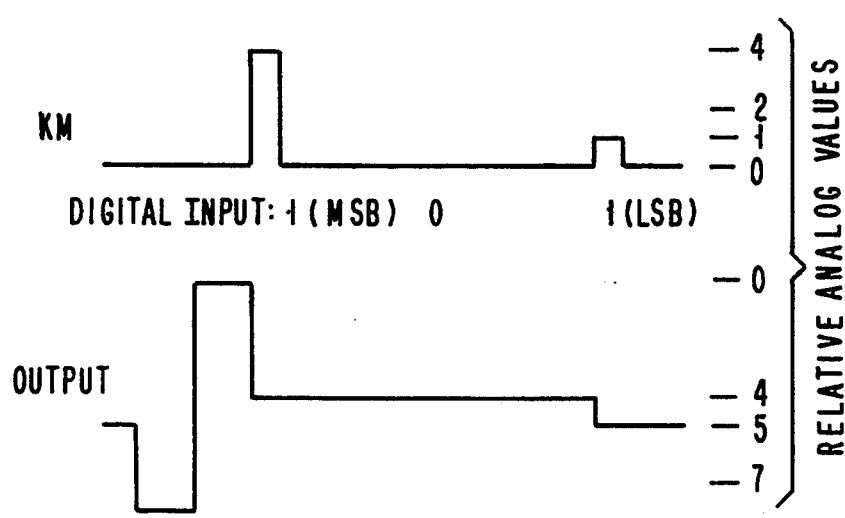
FIG. 2E

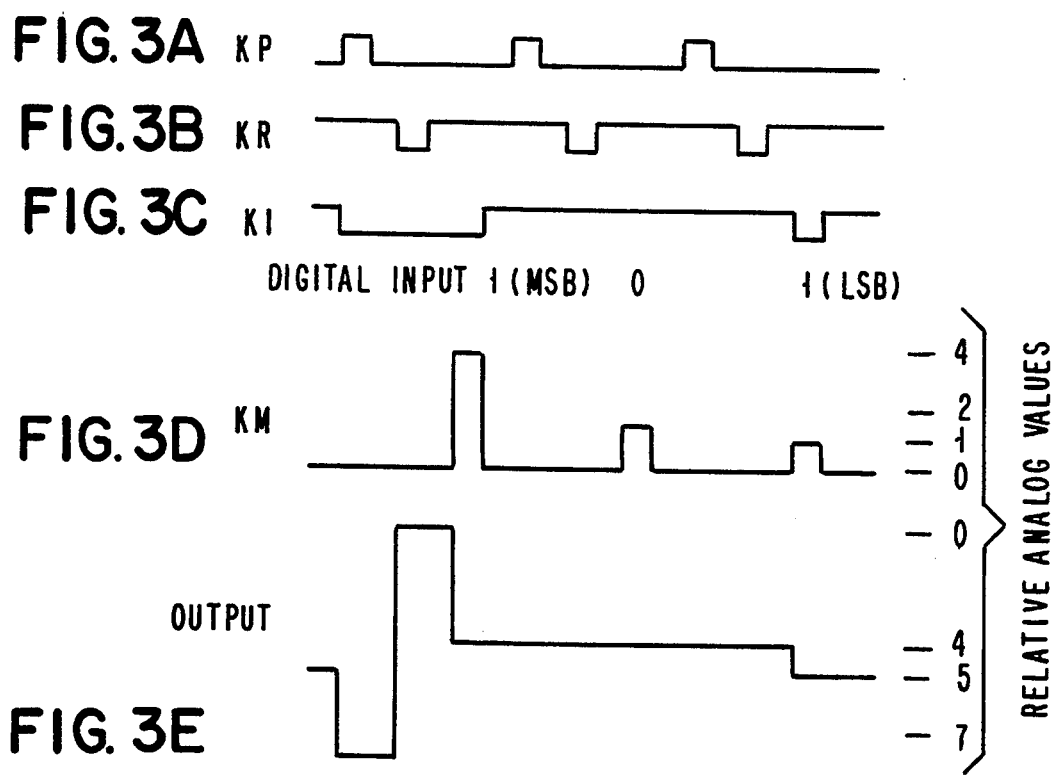
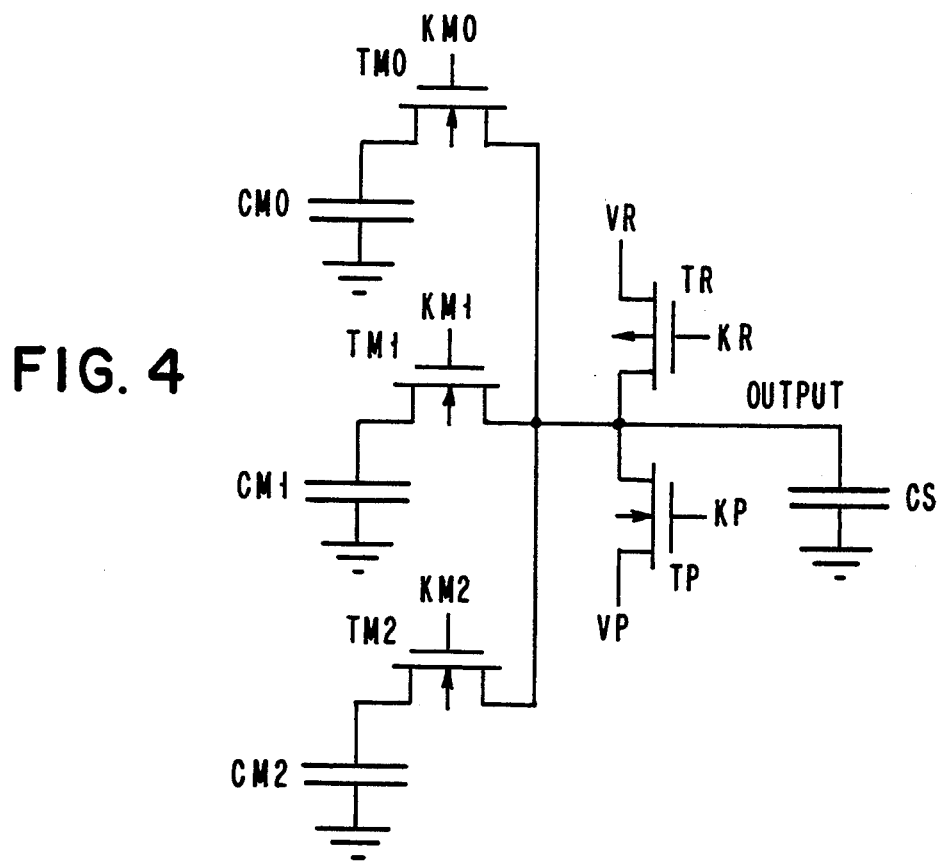

FIG. 5C KM0 (LSB)  DIGITAL INPUT = 1   = 1  
                                       = 0

FIG. 5D KM1  DIGITAL INPUT = 0   − 2  
                                  − 0

FIG. 5E KM2 (MSB)  DIGITAL INPUT = 1   − 4  
                                        − 0

OUTPUT   − 0  
         − 5  
         − 7

FIG. 5F

RELATIVE ANALOG VALUES

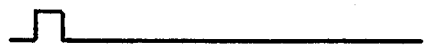
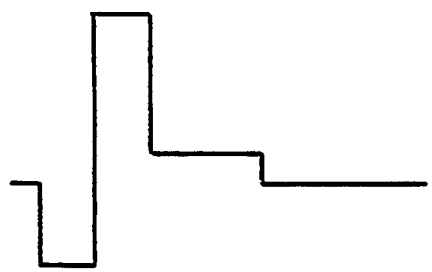
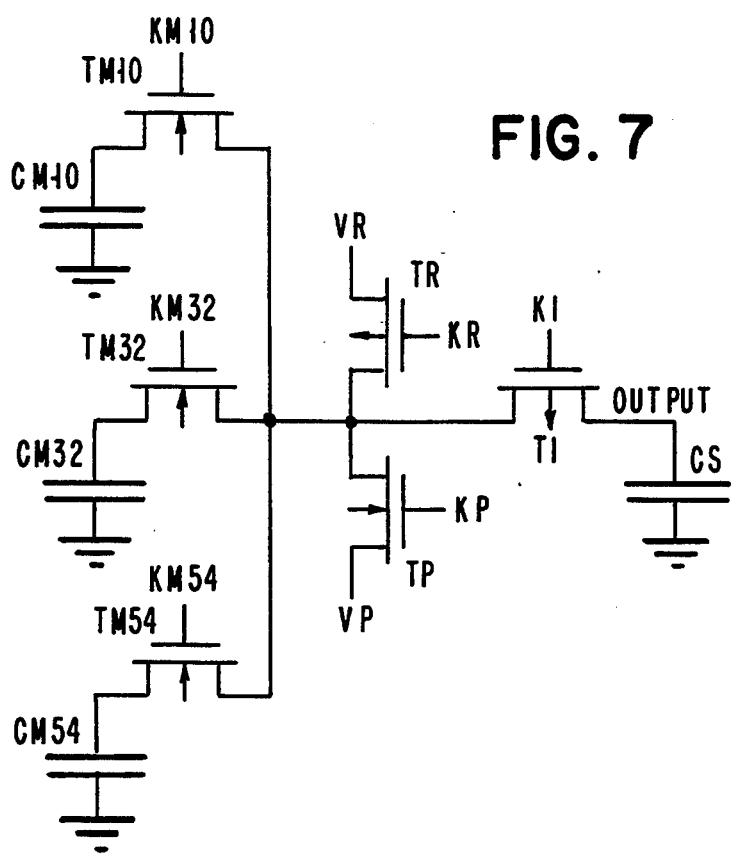

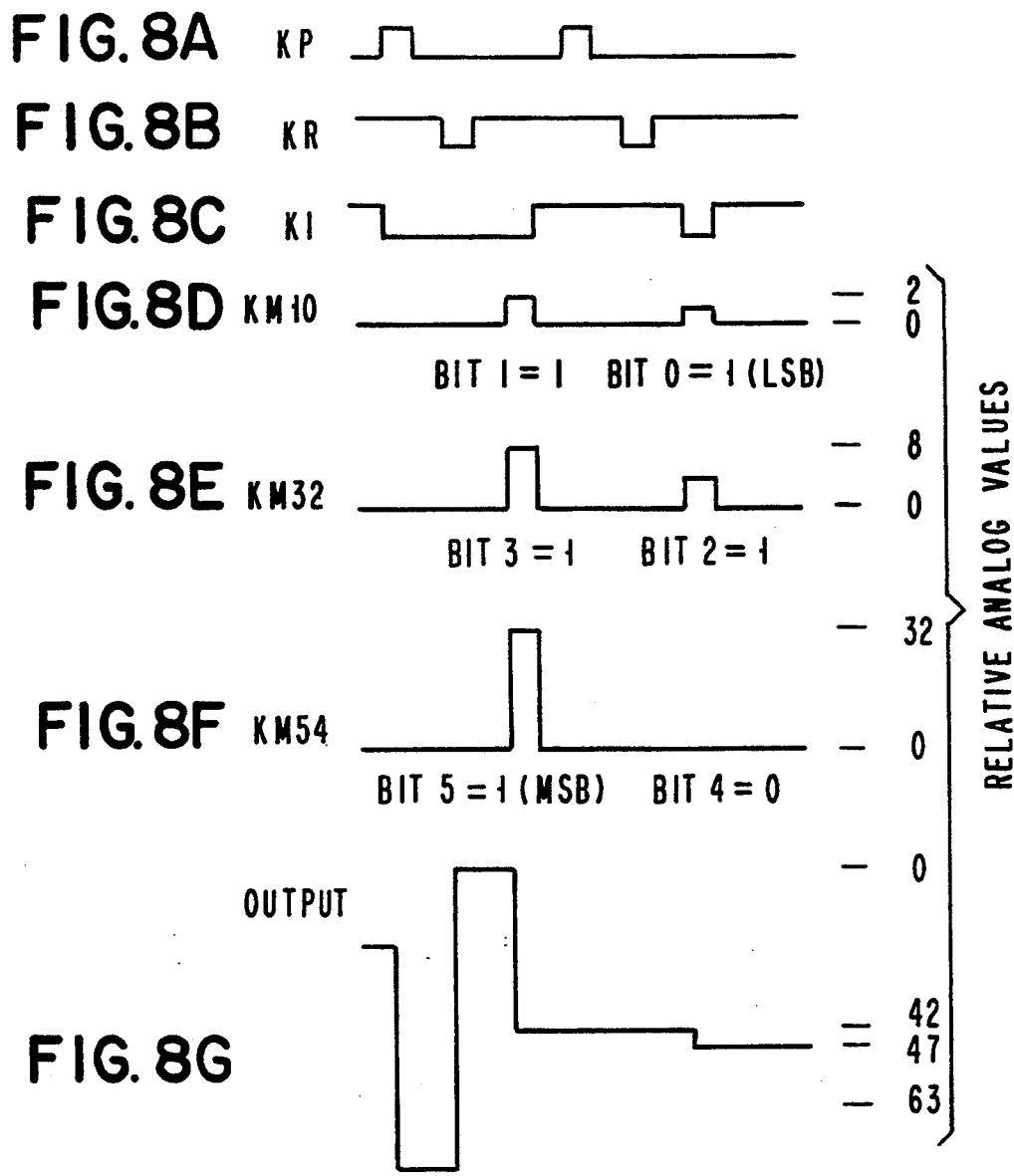

CHARGE SUMMING DIGITAL TO ANALOG CONVERTER

BACKGROUND OF THE INVENTION

1. Technical Field

This invention relates to digital to analog (D/A) conversion in data line driver subsystems for flat panel active matrix displays such as thin-film transistor liquid crystal displays (TFT-LCD). More specifically, it relates to the type of display which receives its pixel data in digitally encoded form and converts the digital data to analog data line signals in each data driver circuit.

2. Background Art

In the above mentioned displays the number of colors or gray levels that can be precisely displayed is limited in part by the precision and accuracy of the D/A conversion. For economic reasons, more than one hundred data driver circuits, along with associated digital circuitry, must be integrated into each monolithic silicon chip. This requirement eliminates from consideration most of the conventional means of achieving high D/A performance.

A copending application by the present inventor, U.S. patent application Ser. No. 07/968,699, filed on Oct. 30, 1992, and entitled "Pipeline Charge Metering Digital-To-Analog Data Line Driver", which is hereby incorporated by reference, teaches the application of charge metering techniques to the sampled-ramp or sampled-staircase type of data line driver. While this is an advance in the art, is retains the limitation that the speed required of the circuits scales with the precision (the number of gray levels or colors to be represented by the analog output).

A D/A converter using summing of binary weighted charge packets is the subject of U.S. Pat. No. 3,836,906 by Ando et al. The particular method used by Ando et al has the following disadvantages:

1. The output contains error contributions from the uncertainty of the threshold voltages of several MOS transistors. This is compounded by the fact that the output, including the output for analog zero, has a finite pedestal due to the necessary minimum charge contributions from each binary input. The pedestal contains threshold uncertainty which may be larger than the smallest analog outputs.

2. Multiple capacitors are used, one for each bit plus one, having sizes in binary-weighted sequence. Thus there is a large ratio of sizes between the largest and the smallest capacitor. If the smallest is large enough to make the ratio very precise, the capacitors occupy very large amounts of chip area.

3. The largest of the capacitors must be formed differently than the others. The others share a common electrode, such as the silicon substrate, but the largest must have two independent electrodes. This complicates the technology and makes its area larger than it would otherwise be.

4. The binary weighted charge packets to be summed are provided directly by the digital inputs, which are loaded by the binary weighted capacitors.

5. The output voltage dynamic range is about one-half of the largest voltage supply.

SUMMARY OF THE INVENTION

It is an object of this invention to provide a D/A converter which is suited to the display data driver application, is capable of high precision and requires modest circuit speed.

It is another object of the invention to provide a charge summing D/A converter which is free of error due to threshold voltage variation.

It is yet another object of the invention to provide a D/A which uses only capacitors which share a common electrode.

It is still another object of the invention to provide a D/A converter which requires only a modest ratio between the largest and smallest capacitor, and which may be configured with as few as two such capacitors.

It is a further object of the invention to provide a D/A converter which has an output voltage dynamic range only moderately less than the largest voltage supply.

It is yet an additional object of the invention to provide a D/A converter which does not derive charge packets directly from the binary inputs.

The present invention is distinguished from the two copending applications, in part, by the feature that multiple metered charge packets are summed in a charge summing capacitor, and that in the parallel embodiment multiple charge metering switches and multiple metering capacitors are used.

In the present invention, depending on the particular embodiment, the circuit speed may be dependent on the number of binary bits needed to encode the number of gray levels or colors (a much smaller number than the number of gray levels or colors) or virtually independent of the precision. As a result, analog pipelining (explained in the copending application) becomes optional, rather than a .practical necessity. Charge metering is explained in detail in a second copending application by the present inventor, U.S. patent application Ser. No. 07/968,698, filed on Oct. 30, 1992, and entitled "Charge Metering Sampling Circuit and Use Thereof In TFT/LCD" which is hereby incorporated by reference.

In the copending U.S. patent application Ser. No. 07/968,699, filed on Oct. 30, 1992, entitled "Pipelined Charge Metering Digital-To-Analog Data Line Driver", it is explained how to use a second charge metering circuit as an analog latch to achieve analog pipelining, thus minimizing the speed required of the D/A conversion function. This is less essential with the present invention but may be incorporated if desired. That application also explains how to use the second stage to avoid dependence of the output voltage upon the capacitance of the data line. This also may be applied to the present invention. The copending application also explains how to perform the periodic voltage inversion which liquid crystals require for reliability. This also is applicable to the present invention. Thus, only the D/A function will be detailed here.

The invention is preferably embodied in a CMOS monolithic integrated circuits incorporating capacitors having one terminal, such as the substrate, in common. In the typical application of data line driver circuits for thin-film transistor liquid crystal displays, more than one hundred data line driver circuits are often incorporated in each silicon chip. Each circuit is associated with a display data line. During each display line time, it receives a digital word representing a displayed gray level or color component and converts it to an analog voltage which it applies to the data line, to be stored in a display cell.

The D/A function is performed by a specialized charge metering circuit preferably operating in the inverting, negative output change mode. The circuit may use a single charge metering capacitor and a single NMOS charge metering switch, or else one of each for each binary bit of the input, or else an intermediate number of each. One NMOS precharging switch, one PMOS reference setting switch and one charge summing capacitor are used.. A PMOS isolating switch is used in some embodiments. The transistor types specified are preferred embodiments, other types may be substituted as explained in the copending application. In operation, after precharging and reference setting, charge packets are transferred from the charge metering capacitors, through the channels of the charge metering switches, into the charge summing capacitor which collects the sum of the transferred charge packets. The transferred packets each represent the analog value of an input bit which has a binary-one value, so the output voltage across the charge summing capacitor is proportional to the analog value of the digital word.

In the case of a single metering capacitor and switch, the packets must be generated for the bits in sequence. After the first packet is generated the isolating switch must be turned off during the subsequent precharging and reference setting operations to avoid disturbing the partial sum, and turned on for the transfer of each successive contribution to the sum. The same applies to any embodiment using fewer metering capacitors and switches than bits.

When the number of metering capacitors and switches is equal to the number of bits, the precharging and reference setting need be done only once. The transfer of charge packets representing the values of the binary-one bits may be done either simultaneously, for the highest speed, or in bit-position sequence starting with the most significant bit, for the largest voltage dynamic range.

BRIEF DESCRIPTION OF THE DRAWINGS

FIG. 1 is a schematic diagram of a serial charge summing D/A converter of the invention.

FIGS. 2A to FIG. 2E are timing waveform diagrams for the circuit of FIG. 1, with the 3-bit digital input imposed on the input to the charge metering switch.

FIGS. 3A to FIG. 3E are tinting waveform diagrams for the circuit of FIG. 1, with the 3-bit digital input imposed on the input to the isolating switch.

FIG. 4 is a schematic diagram of a 3-bit parallel charge summing D/A converter in accordance with the invention.

FIGS. 5A to FIG. 5F are timing and waveform diagram for the circuit of FIG. 4, with the digital input imposed on the inputs to the charge metering switches, for the case of a simultaneous digital input.

FIGS. 6A to FIG. 6F are timing waveform diagrams for the circuit of FIG. 4, with the digital input imposed on the inputs to the charge metering switches, for the case of a bit-sequential digital input.

FIG. 7 is a schematic diagram of a parallel/serial charge summing D/A converter of the invention, having three parallel charge metering branches.

FIGS. 8A to FIG. 8G are timing waveform diagrams for the circuit of FIG. 7, with the digital input imposed on the inputs to the charge metering switches, for the case of a 6-bit input.

DETAILED DESCRIPTION OF THE INVENTION

Figure 9:
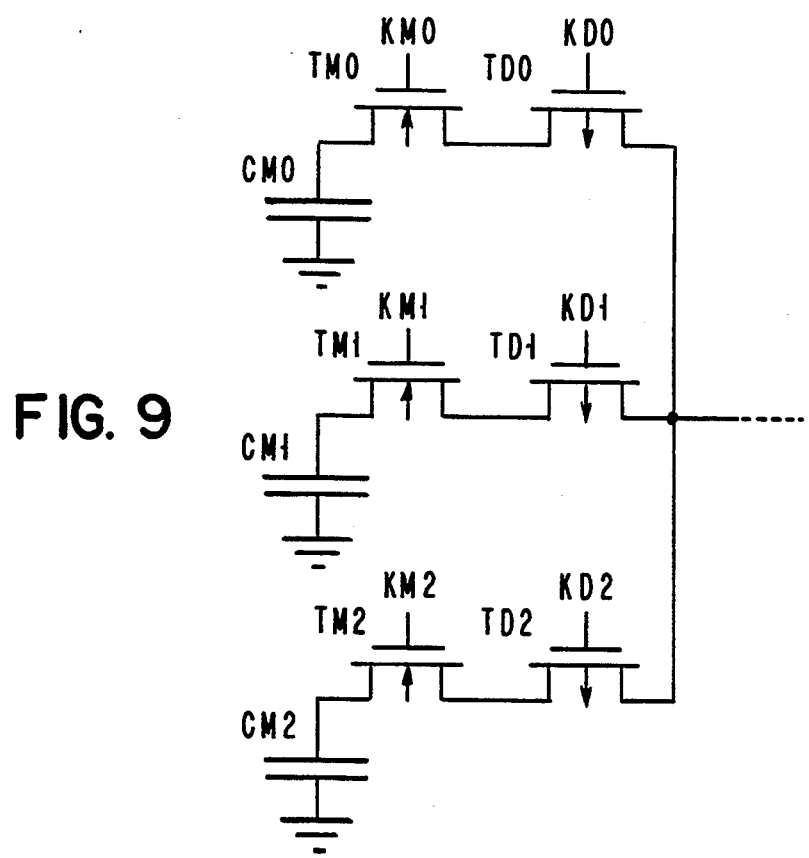
FIG. 9 is a partial schematic diagram illustrating the option of imposing a digital input on the inputs to added digital switches in tandem with the charge metering switches.

This invention is generally embodied as CMOS integrated circuits on a silicon chip. It uses the charge metering sampling circuits of the aforementioned copending applications to perform the analog-to-digital conversion function of data line driver for active-matrix liquid crystal display panels. In the schematic diagrams of the figures, NMOS transistors are identified by an arrow directed at the device and PMOS by one directed away. As explained in the copending applications, the types of all the transistors except those in the charge metering switch are matters of engineering choice. That of the charge metering switch partly determines the mode of operation. Capacitors are generally integrated into the chip and share a common electrode, such as the silicon substrate. The load capacitance of the first stage of a data line driver, however, is generally the capacitance of a display data line.

Looking at one of the many data line drivers of a display, during each operating cycle it receives a digital word representing a gray level or color component and presents it to the input of the D/A stage, which converts it to an analog voltage which it applies to the display data line either directly or with an intervening analog output stage. If the time required to convert the signal is short, it is sufficient to present the output to the data line for the remainder of the line time, otherwise analog pipelining must be provided as taught in a copending application.

In the circuit of the invention, each binary-one bit of the digital input generates a bit-equivalent packet of electrical charge with a magnitude proportional to the analog value of the bit. The charge packets are added in a charge summing capacitor. The voltage across the charge summing capacitor is then proportional to the analog equivalent of the digital input. The generation of a bit-equivalent charge packet is accomplished by applying an input voltage pulse of bit-equivalent amplitude to the gate of a charge metering switch. For binary-0 bits, the application of the corresponding bit-equivalent voltage pulse is prevented, or else the generation or transfer of the bit-equivalent charge packet is prevented.

In various embodiments the bits may be converted serially in a circuit with a single charge metering branch comprised of a charge metering capacitor and a charge metering switch, or else simultaneously in a circuit with as many parallel charge metering branches as there are bits in the digital input, or else sequentially in a circuit of the latter type, or else partially or fully sequentially in a parallel/serial circuit having fewer charge metering branches than there are bits.

A serial circuit is shown in FIG. 1, and timing and waveform diagrams for a 3-bit input of 101, as an example, is shown in FIGS. 2A to FIG. 2E and FIGS. 3A to FIG. 3E. In FIGS. 2A to FIG. 2E, the digital inputs are derived from circuits (not shown) to control the input signal KM to charge metering switch transistor TM, so that only the bit-equivalent voltage pulses which correspond to binary-1 bits are applied. At the beginning of an operating cycle KI falls to turn on isolating switch transistor TI. With KM at its baseline value, KP rises briefly to turn on transistor TP to precharge capacitor CM to VP, which is lower than the channel potential of transistor TM. Capacitor CS also receives some negative charge through the channels of transistor TM and transistor TI. Then KR falls briefly to turn on transistor TR to initialize capacitor CS to high voltage VR. While transistor TR is on, excess charge spills from capacitor CM until the voltage across capacitor CM is in equilibrium with the channel potential of transistor TM. The spilled charge is absorbed by the VR supply. The first bit is binary-1, so the-bit equivalent pulse makes KM rise in voltage by an amount proportional to the analog value of the bit. For the largest output voltage dynamic range, the first bit should be the most significant (MSB), and so on in sequence. The rise of KM causes negative charge to flow from capacitor CM, through transistor TM and transistor TI, into capacitor CM, reducing its potential. The ratio of the voltage change on capacitor CS to that of KM is the gain, which is approximately $-CM/CS$. The available output dynamic range is slightly less than VR-VP, and for each bit the maximum absolute output change is the remaining dynamic range less the input change. Thus a reasonable design point is a KM amplitude for the MSB of one-half the dynamic range and a gain of $-1$, as in FIGS. 2A to FIG. 2E and FIGS. 3A to FIG. 3E.

KM returns to the baseline and KI rises to turn off transistor TI, isolating capacitor CS. The initialization sequence of KP and KR repeats, procharging capacitor CM as before but leaving capacitor CS undisturbed. Transistor TI is turned on but the second bit is binary-0 in the example, so KM does not change and no charge is transferred to capacitor CS. When transistor TI turns off, the initialization is repeated, transistor TI turns on and KM rises proportionally to the third, least significant bit. Charge is transferred from capacitor CM to capacitor CS, adding to that supplied by the first bit and further reducing the output potential. KI turns off to complete the cycle. The change in the output voltage from the reference value of VR is proportional to the relative analog value of the digital input (ie its decimal equivalent), which is 5 in the example.

In embodiments like that of FIG. 1, which require repeated procharging and initialization during a conversion, it is necessary that the value of capacitor CS be large compared to the stray capacitance of the node labelled "A" so that charge sharing errors are negligible.

The operation shown in FIG. 3A to FIG. 3E is similar, except that the digital input controls KI instead of KM. Thus, each bit-equivalent pulse is present in KM regardless of the value of the binary bit, but for binary-0 bits transistor TI is not turned on and the resulting charge packet cannot reach capacitor CS. It is absorbed in the VR supply during the next initialization.

The parallel circuit of FIG. 4 has a separate charge metering branch for each of the three bits. FIGS. 5A to FIG. 5E illustrate the operation for a 101 input when the bits are converted simultaneously. The three charge metering capacitors are assumed to be equal in value. The binary bits control the presence of the corresponding bit-equivalent pulses at the gate inputs to the charge metering switches. The MSB input change is assumed to be one-half the dynamic range, so for simultaneous inputs the maximum gain is about $-0.5$ and the maximum output change is about one-half the dynamic range. For a large number of bits a preferred design would use a smaller value of charge metering capacitor of the lower order bits, and correspondingly larger amplitude for the corresponding bit equivalent input pulses. This would avoid inaccuracies due to excessively small bit-equivalent input pulses while using a modest ratio of capacitor values.

In FIGS. 5A to FIG. 5F it may be seen that the quiescent value of the KMx inputs is below the baseline voltage. In the absence of an isolating switch, this avoids disturbance of the output by stray charge transfer due to noise or subthreshold conduction in transistor TMx. An isolating switch may be added instead.

At the start of an operating cycle KMx rise to the baseline, KP and KR act to precharge and initialize the circuit as above, then the bit-equivalent pulses for the binary-1 bits occur, transferring charge to capacitor CS to create the output. Finally KMx return to the quiescent voltage level.

FIGS. 6A to FIG. 6F show the operation of the circuit of FIG. 4 with the inputs to the charge metering switches applied sequentially rather than simultaneously, beginning with the most significant bit input and continuing in descending order of significance. By following this sequence the amplitude of the bit-equivalent input pulses decrease as the output change increases with increasing added charge. Since the input and output excursions share the available voltage range, this increases the allowable output dynamic range to slightly less than VR-VP. Since each charge metering branch is used only once per operating cycle, precharging and initialization is done only once. KMx has a quiescent level below the baseline level as explained above.

A reasonable design uses a gain of $-1$ and a MSB-equivalent input pulse of slightly less than one-half the dynamic range. Again, the use of smaller charge metering capacitors for the lowest significant bits can improve the accuracy.

FIG. 7 shows the invention configured for a hybrid parallel-serial operation. The timing and waveform diagram of FIGS. 8A to FIG. 8C show how 6-bit operation is obtained using three charge metering branches. An isolating switch transistor TI is used, so the quiescent level of KMxx is the baseline level. In operation, transistor TI is turned on, KP and KR precharge and initialize the circuit, then the three charge metering branches receive bit-equivalent pulses simultaneously to generate the charge corresponding to three of the bits, bits 1, 3 and 5 in this example. Transistor TI is turned off to isolate capacitor CS, the circuit is precharged and initialized again, transistor TI is turned on, and then the three charge metering branches are operated in parallel again with the appropriate bit-equivalent pulses to generate, in this example, bits 0, 2 and 4. In this example bit 4 is binary-0 so no bit-equivalent pulse is applied for it. Finally transistor TI is turned off.

It will be recognized that the three charge metering branches can be operated sequentially as described above for the case of FIG. 5. Also, as with serial embodiments capacitor CS must be large enough to make charge sharing errors negligible.

Figure 10:
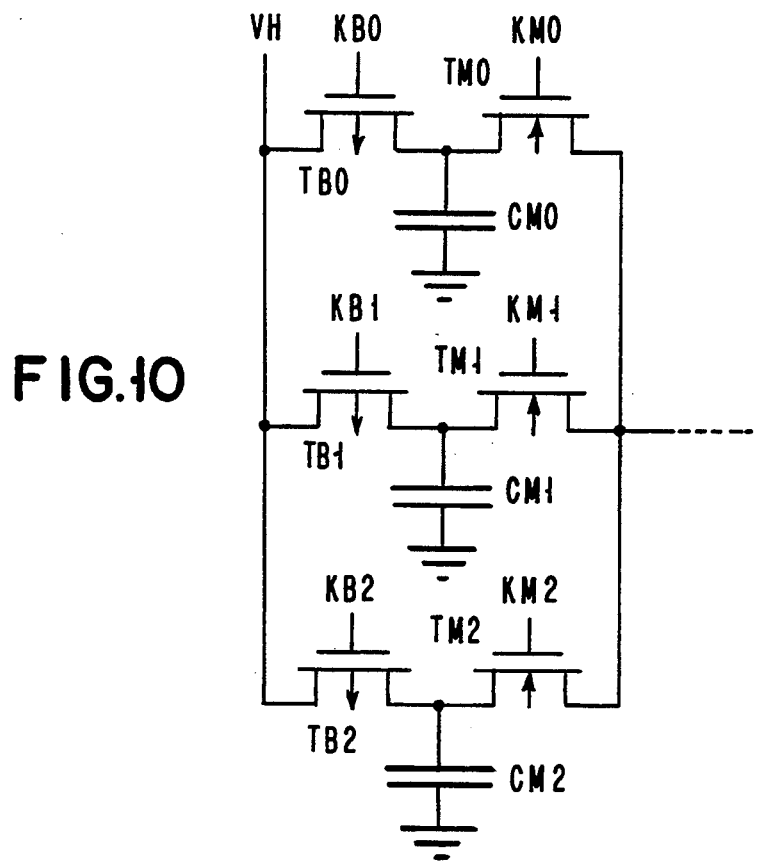
FIG. 10 is a partial schematic diagram illustrating the option of imposing a digital input on the inputs to added hold switches.

In the circuit of FIG. 7, applying the feature of using smaller charge metering capacitors for lower order bits, capacitor CM32 has half the capacitance of capacitor CM54 and capacitor CM10 has half that of capacitor CM32. The ratio of largest to smallest capacitor CMxx is four and that between the largest and smallest input amplitude is eight, as compared to 32 if the capacitors were equal. Similarly, if the voltages were equal a ratio of 32 between the largest and smallest capacitors would have been needed. FIGS. 9 and 10 are partial schematic diagrams showing only the charge metering branches, showing two ways of incorporating the digital input into a parallel or parallel/serial circuit without controlling the application of the bit-equivalent pulses to transistor TMx. In FIG. 9 the added switches are pass gates TD0 through TD2 placed in tandem with the corresponding charge metering switch. If a bit is binary-1, the corresponding KDx input is low, TDx is turned on, and charge can be transferred to capacitor CS. For binary-0 bits, the corresponding KDx is high, the TDx is off, and charge transfer is blocked. In FIG. 10 the added switches are hold switches TBx, which are disposed to connect the charge metering capacitors to a high voltage VH only when the corresponding bit is binary-0. They are turned on for binary-0 bits after initialization and before the KMx signals, pulling the corresponding charge metering capacitors to VH so the corresponding transistor TMx cannot be turned on to transfer charge.

One or more additional bits may be added to the precision of the charge summing D/A without increasing the number of precise binary-equivalent analog inputs supplied to the charge metering devices.

In the charge summing D/A converters of the invention, an additional bit may be added by interpolating between the original output states. No additional binary-equivalent inputs are needed, and, in the serial or parallel-serial embodiments, no additional circuit components are needed. In the fully parallel embodiment, a significant increase of the number of components would be needed, thus this method would be less attractive than the usual way of adding a bit. In the new method, the original output states are obtained by supplying the binary-equivalent inputs twice and summing. The new output states are obtained by supplying the binary-equivalent inputs just above and just below, and summing. The gain is halved (if desired) by means of the ratio of capacitors. The result is interpolation between the original levels, which is equivalent to adding a bit. It will be apparent that more than one bit may be added by interpolation. For example, to add two bits one adds an appropriate combination of binary equivalent inputs four times, optionally with one-quarter the gain.

A charge summing circuit may also be used to interpolate between output states of one or more D/A of a type other than charge metering.

In order to add an additional bit by shirting the output, in the circuits of FIGS. 1, 4 and 7 two values of reference voltage VR are to be provided, VRA and VRB, differing by the analog equivalent of the new LSB. The preferred way of applying the two references to the circuit is by means of two reference switch devices, TRA and TRB respectively, each having one of its source/drain electrodes connected to the respective reference voltage source and the other connected as usual to the output node of the circuit. The gate electrodes are connected to control signals KRA and KRB respectively. Following the assumptions underlying the figures, the reference switch devices are assumed to be PMOS. Also it is assumed that VRA is the higher potential.

In this method, the binary value of the new LSB determines which reference switch device is turned on. For binary-0, KRA goes low while KRB stays high, and thus only TRA turns on and VRA is applied. For binary-1, only KRB goes low and thus only TRB turns on and VRB is applied.

It is alternatively possible to apply this method to an inverting charge metering stage other than the D/A proper when such are present in cascade with the D/A.

The disclosed circuits may find application as a general purpose analog summer. Summing of analog signals differs From averaging only by a scale factor. The disclosed circuits can therefore be used to average analog signals with inversion. The scale factor may be included by using a gain with an absolute value equal to the reciprocal of the number of input signals. Where the number of input signals is two, this operation is equivalent to linear interpolation between the inputs. As explained above, more than one interpolated output state may be obtained between input states by repeated application of the inputs.

While this invention has been described in connection with the preferred embodiments, it will be understood that those with skill in the art may be able to develop variations of the disclosed embodiment without departing from the spirit of the invention or the scope of the following claims:

I claim:

1. A digital to analog converter comprising:
   a storage capacitor;
   charge metering means for receiving for each bit of a digital signal, a voltage pulse of bit-equivalent amplitude wherein at least some of said voltage pulses are of differing amplitudes, and for generating for each bit of said digital signal a bit-equivalent electrical charge packet having a magnitude proportional to an analog value of said bit; and
   means for supplying said charge packets to said capacitor to produce on said capacitor a voltage proportional to the analog value of said digital signal.

2. The digital to analog converter of claim 1 wherein said charge metering means comprises a plurality of charge metering circuits, each circuit receiving one said bit and generating one said charge packet.

3. The digital to analog converter of claim 2 wherein said charge metering circuits operate in parallel.

4. A digital to analog converter of claim 2 wherein each of said charge metering circuits includes a capacitor, said capacitor being for storing said charge to be metered.

5. The digital to analog converter of claim 4 wherein each of said capacitor is of equal capacitance.

6. The digital to analog converter of claim 2 wherein selected ones of said charge metering circuits receive for respective successive bits of said digital signal, voltage pulses of equal amplitude, each of said selected ones of said charge metering circuits including a capacitor, said capacitors having capacitance values related to one another as successive powers of two, said charge metering circuits being used for respective successive bits.

7. The digital to analog converter of claim 1 wherein said charge metering means comprises a single charge metering circuit, said circuit operating on said bits of said digital signal sequentially.

8. The digital to analog converter of claim 7 wherein said charge metering circuit comprises:
   a charge source capacitor; and
   means for applying charge to said charge source capacitor.

9. The digital to analog converter of claim 1 further comprising isolating means for isolating said storage capacitor from said charge metering means.

10. The digital to analog converter of claim 9 wherein said isolating means is an FET.

11. The digital to analog converter of claim 1 wherein said charge metering means includes at least one FET and at least one charge source capacitor, said FET having a source electrode connected to said charge source capacitor and a gate electrode connected to a source of input signals, wherein the magnitude of said charge source capacitor combined with the amplitude of said input signals determines the magnitude of said bit equivalent charge packet.

12. The digital to analog converter of claim 1 wherein said charge metering means comprises a plurality of charge metering circuits, each circuit receiving a plurality of bits and generating for each bit, a respective charge packet.

13. The digital to analog converter of claim 1, wherein said voltages are related to the significance of the bit represented by said voltage.

* * * * *